Figure 1:
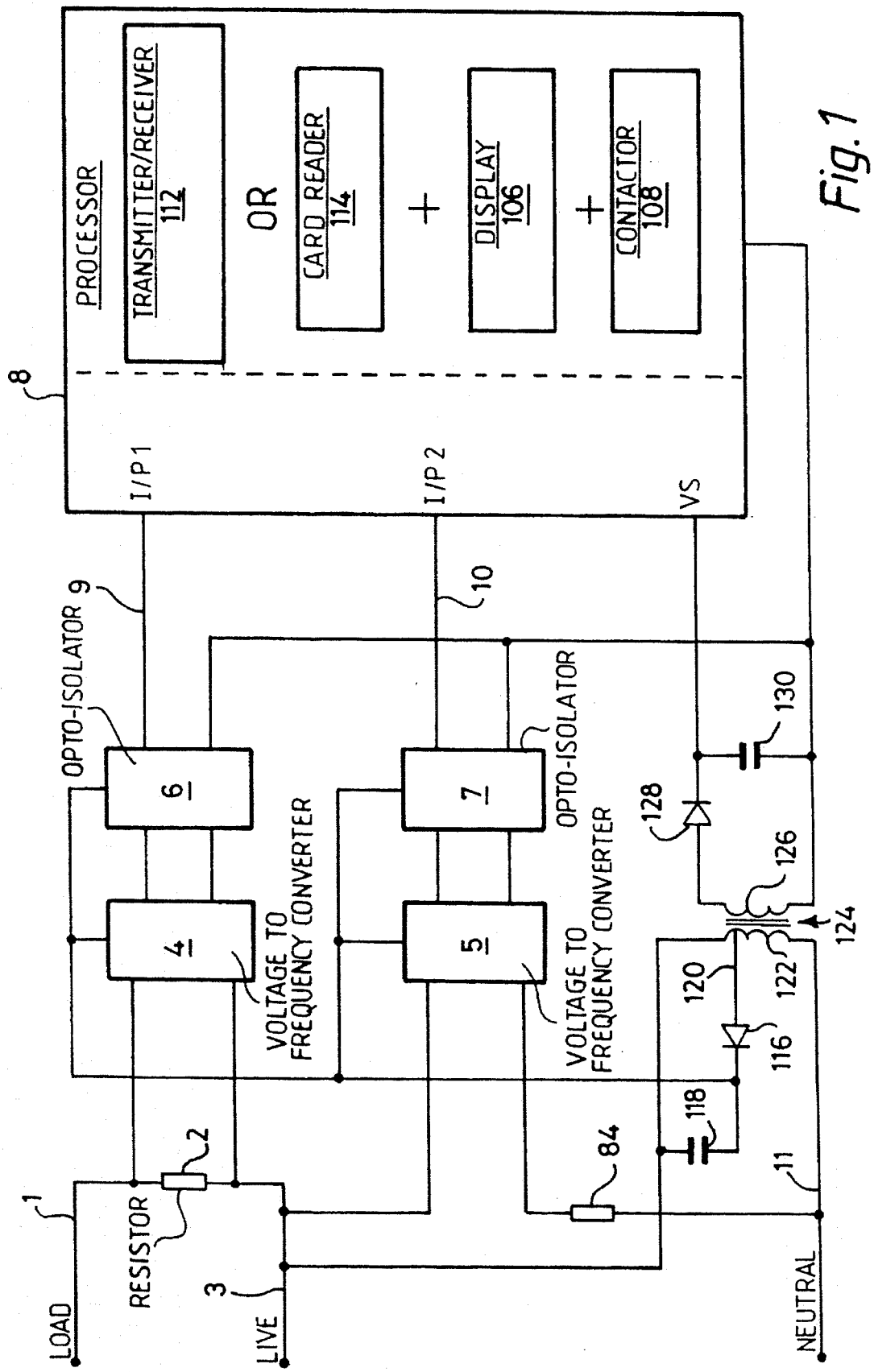

[19] United States Patent
Payne et al.

[11] Patent Number: 5,539,304
[45] Date of Patent: Jul. 23, 1996

[54] CALIBRATION OF POWER METERS

[75] Inventors: Kenneth Payne, Peterboprough; Roger H. King, Thurlby Near Bourne; David A. Watson, Ely, all of United Kingdom

[73] Assignee: Ampy Automation - Digilog Limited, Peterborough, United Kingdom

[21] Appl. No.: 122,502
[22] PCT Filed: Sep. 11, 1992
[86] PCT No.: PCT/GB92/01663
  § 371 Date: Sep. 28, 1993
  § 102(e) Date: Sep. 28, 1993
[87] PCT Pub. No.: WO93/06499
  PCT Pub. Date: Apr. 1, 1993

[30] Foreign Application Priority Data

Sep. 19, 1991 [GB] England ................... 9120004

[51] Int. Cl.$^6$ ................................................. G01R 35/04
[52] U.S. Cl. ................................................. 324/74; 324/130
[58] Field of Search ............................ 324/74, 130, 132, 324/142; 364/571.02, 571.04, 571.05, 571.07

[56] References Cited

U.S. PATENT DOCUMENTS

| | | | |
|---|---|---|---|
| 4,464,723 | 8/1984 | Chartier | 324/132 |
| 4,623,976 | 11/1986 | Carp et al. | 364/571.07 |
| 4,665,358 | 5/1987 | Bullock et al. | 324/142 |
| 4,788,620 | 11/1988 | Scott | 324/130 |
| 4,949,029 | 8/1990 | Cooper et al. | 324/74 |

Primary Examiner—Ernest F. Karlsen
Attorney, Agent, or Firm—Lee, Mann, Smith, McWilliams, Sweeney & Ohlson

[57] ABSTRACT

Apparatus and method is provided wherein power pulses are supplied from a standard meter to a supplementary data accumulating means associated with a meter under test. Data accumulation means in the supplementary data accumulating means and in the meter under test are set to a known value and both meters are subjected to similar voltage and current values. A stop signal is generated when the supplementary data accumulating means reaches a predetermined value N and the value in the meter data accumulating means is latched. The stop signal causes arithmetical division of the latched value by N to form a quotient value and is entered into a reference value memory in the meter under test, the reference value memory value determining the number of pulses per unit power pulse generated by the meter.

14 Claims, 10 Drawing Sheets

CALIBRATION OF POWER METERS

FIELD OF INVENTION

This invention concerns the calibration of apparatus designed to measure electrical power, methods and apparatus therefor.

BACKGROUND OF THE INVENTION

It is known to measure voltage and current to ascertain the power consumption from a supply typically an alternating current supply, by generating signals corresponding to the voltage and current, producing a product of the two signals and integrating the result over a period of time.

In recent years development work has been concentrated on meters incorporating solid state devices for performing some of the computations. Potentially such devices allow more accurate measurement than older electromechanical designs of meter and will also enable remote reading to be incorporated more readily into such meters.

After manufacture (or refurbishment) it is necessary to calibrate such meters relative to some standard—usually by comparing the power reading obtained using the meter under test against that measured by a "standard" meter, and adjusting the former as appropriate.

It is an object of the present invention to provide power measuring apparatus which can be readily calibrated using a standard.

It is a further object of the invention to provide a method of calibration for power measuring apparatus and apparatus for calibrating said meters.

SUMMARY OF THE INVENTION

According to the present invention in power measuring apparatus adapted to produce an output signal proportional to the product of a supply voltage and current flowing through a load connected thereto, in which a first signal is derived proportional to the supply voltage and a second signal is derived proportional to the load current, so that a product signal can be produced, and wherein the product signals are accumulated in a first register to produce a unit power pulse when a predetermined value has been accumulated in the register, which unit power pulses are in turn accumulated in a power register to indicate total power measured, apparatus for calibrating the power measuring apparatus against a standard meter comprises:

(1) circuit means responsive to unit power pulses (or pulses derived therefrom) from the standard meter for entering said pulses into a second register for accumulating unit power pulses from the standard meter, (2) measuring means for storing a value N with which the accumulating value in the said second register can be compared, (3) pulse generating circuit means for generating a calibration signal when the value in the second register equals the value N in the memory means, (4) divider means for dividing the value in the said first register by the value N to produce a reference value in response to the generation of a calibration signal, and (5) means for retaining the said reference value for future reference within the meter under test, as the said predetermined value with which the accumulating value in the first register is to be compared for generating unit power pulses by that meter.

Where the unit power pulses from the standard meter are generated at an appropriate rate and are available at an output socket, the said calibrating circuit means may simply comprise conductor means for connecting the said output socket to an input socket on the meter under test, for conveying the unit power pulses from the standard meter to the said second register in the meter under test.

Where as is more likely the standard meter produces at the output socket more unit power pulses per KWH than are generated by the circuits of the meter under test when measuring the same power (typically 500 times as many), the calibrating circuit means preferably also includes divider means to produce one pulse for every n pulses from the standard meter, (where n may for example be 500).

Where the meter under test includes an optical communication port (such as one operating in accordance with the GIMEX protocol), the circuit means may comprise a housing containing a light source, conductor means for connecting to the said output socket to convey unit power pulses to the housing, driver means within the housing for generating electrical signals to energise the light source to produce a flash of light for each unit power pulse supplied thereto from the standard meter (or one such light pulse for every n pulses from the standard meter) and the housing and the meter under test are positioned so that light from the light source is projected towards the optical communication port of the meter under test, and electrical signals generated from each flash of light received by the meter under test are accumulated in the said second register of the meter under test.

By replicating the calibrating circuit means M times, so M meters can be calibrated against a standard meter simultaneously.

According to another aspect of the invention a method of calibrating apparatus adapted to measure power by accumulating in a primary data accumulating means data values proportional to the product of signal values which are proportional respectively to a supply voltage and to the current flowing through a load connected thereto, and generating a unit power pulse each time the accumulating data value have increased by a predetermined amount, and accumulating the number of unit power pulses as a numerical value indicative of the power consumed by the load, comprises the steps of:

(1) establishing a path for supplying to a supplementary data accumulating means unit power pulses from a standard meter, (2) setting the value in the primary data accumulating means of a meter under test and the said supplementary data accumulating means, to a known value (typically zero), (3) causing the standard and test meters to measure the same supply voltage and load current and generating a stop signal when the accumulating value in the supplementary accumulating means equals a predetermined value N, (4) employing the stop signal simultaneously to latch the value in the primary accumulating means in the meter under test and divide the latched value by N to form a quotient value, and (5) entering the quotient value into a reference value memory means within the meter under test, which is adapted to store the said predetermined value with which accumulating values in the primary accumulating means are to be compared to determine when unit power pulses are to be generated by the meter under test during future power measurement by the said meter.

The path for supplying unit power pulses to the meter under test may be by way of one or more conductors or may comprise an opto-electric link involving a modulated light source (such as an LED) and a light detector (such as a light sensitive transistor), particularly where at least the meters under test are provided with an optical communication port such as one operating in accordance with the GIMEX protocol.

The method also envisages connecting M meters under test to a standard meter as aforesaid to enable M meters to be calibrated simultaneously, by inserting a value into each meter with which future accumulating product values are to be compared, for the generation of unit power pulses by each said meter under test.

The method of calibration preferably includes the step of disabling the facility for writing to the said reference value memory means after a meter under test has been calibrated. The disabling may be permanent (so that the meter can never be recalibrated subsequently) or may be semi-permanent and reversible as for example by means of a hardware or software key, or both, to enable "authorised-only" recalibration.

Apparatus for permitting the disabling step for example may comprise a fusible link, or a programmable only memory which can be write-inhibited.

Where processing and memory capacity within the processor in a power measuring meter as aforesaid is limited, the calibration computations may be performed by externally located processing means which receives data from and transmits data to the meter under calibration via one or more opto-electric links.

In a particularly preferred arrangement a master processor is programmed to control the complete sequence of calibration tests on a plurality of meters which communicate therewith and with a standard meter via a corresponding number of intermediate externally located processors, one for each meter under calibration, and each intermediate processor includes first and second counters and memory means and communicates with its associated meter via an opto-electric link.

In such an arrangement the current flowing through the Standard meter and the meters under calibration may be controlled by the programmed master processor as may be also the sequential addressing of the intermediate processor so as to establish and perform a set of tests, and derive from the intermediate processors the results of the tests on the individual meters.

The master processor may be linked to a printer or other output means for providing a readable output of the results of the tests.

The master processor may also be programmed to print calibration labels and serial numbers for these meters for which the results of the tests thereon conform to predetermined limits and specifications, and the serial number allocated to each satisfactory meter may be written into memory means within the meter so that printed labels can be allocated to appropriate meters.

In calibration systems as aforesaid the standard meter is arranged to supply reference signals to each of the meters under calibration, and as a preliminary step the master processor sets each of the counters in each intermediate processor to zero, and thereafter controls each intermediate processor to count into its first counter the number of unit power pulses transmitted thereto from the Standard meter, and into its second counter the number of units power pulses transmitted thereto from its associated meter, whilst the Standard meter and each meter under test are subject to the same supply voltage and the same load current, and the number accumulated in the first counter is latched when the number in each second counter becomes equal to a predetermined number, and as a second step each intermediate processor is interrogated in turn and the latched value therein is read into the master processor memory and as a third step the master processor computes a calibration coefficient (or controls each intermediate processor to computer a calibration coefficient) for each meter under test and controls the insertion of the computed calibration coefficient into each meter memory, the calibration-coefficient serving to control the number of pulses produced by each meter for a given quantity of electrical power measured by the meter.

The master processor may be programmed to perform a further calibration test to be performed on each meter by repeating the counting of reference pulses from the Standard meter and unit power pulses from each meter under test, the latter now operating under the control of the inserted calibration coefficients, and an accuracy figure is computed for each meter from the new value in the second counter of its associated intermediate processor.

The master processor may be programmed to perform still further calibration tests on the meters under test at a low value of load current and at different higher values of load current, and perform checks on the power measured by each meter for each said current value and record the results, to enable the overall accuracy of each meter to be obtained from the recorded results.

The master processor may be a programmable computer.

The calibration method of the invention is of particular application to power measuring apparatus adapted to produce an output signal proportional to the product of a supply voltage and current flowing through a load connected thereto, in which a first signal is derived proportional to the said supply voltage and a second signal is derived proportional to the said load current so that a product signal can be produced by a microprocessor corresponding to the power, and in which third and fourth signals are produced by frequency modulating two constant frequency carrier signals using the said first and second signals and the said third and fourth signals are supplied to the microprocessor for multiplication to produce the power product signal, in place of the analogue first and second signals, such as is described more fully in our copending British Patent Application No. 9120012.1 entitled Improved Power Meter.

The advantages of this type of power measuring apparatus are greater stability with time and temperature and the signals are now in binary form and can be transmitted via electrical isolating devices to enable a user accessible port to be associated with the apparatus. Typically opto-isolators are employed.

In an electrical power measuring apparatus as aforesaid the said third and fourth signals may be transmitted to the microprocessor via electrical isolating devices such as opto-isolators.

The first and second signals are preferably in the form of analogue voltages and may be derived using potential dividers and shunts in known manner. The signals may be obtained without electrical isolation from the supply line but if desired, isolation may be achieved using one or more transformers.

The signal to frequency conversion is most simply effected using voltage controlled pulse generators in which the instantaneous frequency of the pulses from each is controlled by the instantaneous value of the first and second signal voltages respectively.

Processing the third and fourth frequency varying signals in such a meter comprises the following steps:

1. generating a constant frequency clock signal having a frequency many times that of the mean frequency of the said third and fourth signals, 2. continually entering said clock pulses into two counters, 3. capturing the value of one counter at the beginning of each of the pulses making up the said third signal and likewise capturing the value of the other counter at the beginning of each of the pulses making up the said fourth signal, 4. subtracting the previous captured value from the current captured value derived from each counter to form third and fourth difference signals, 5. forming the arithmetical reciprocal of each of the said third and fourth difference signals, 6. subtracting from each said reciprocal a frequency value equal to the mean frequency of the said third and fourth signals to form fifth and sixth signals, and 7. supplying the fifth and sixth signals to and multiplying them in a quadrature multiplying device and supplying the output thereof as the power signal.

Preferably a microprocessor is employed in such a meter for effecting the multiplication of the fifth and sixth signals and the processor is programmed to compute therefrom not only the apparent power but also the apparent instantaneous power, the real energy and power and also the reactive energy and power supplied to the load.

One or both of the aforementioned third and fourth signals may be averaged over a period of time to provide automatic zero power calibration of the apparatus.

Figure 2:
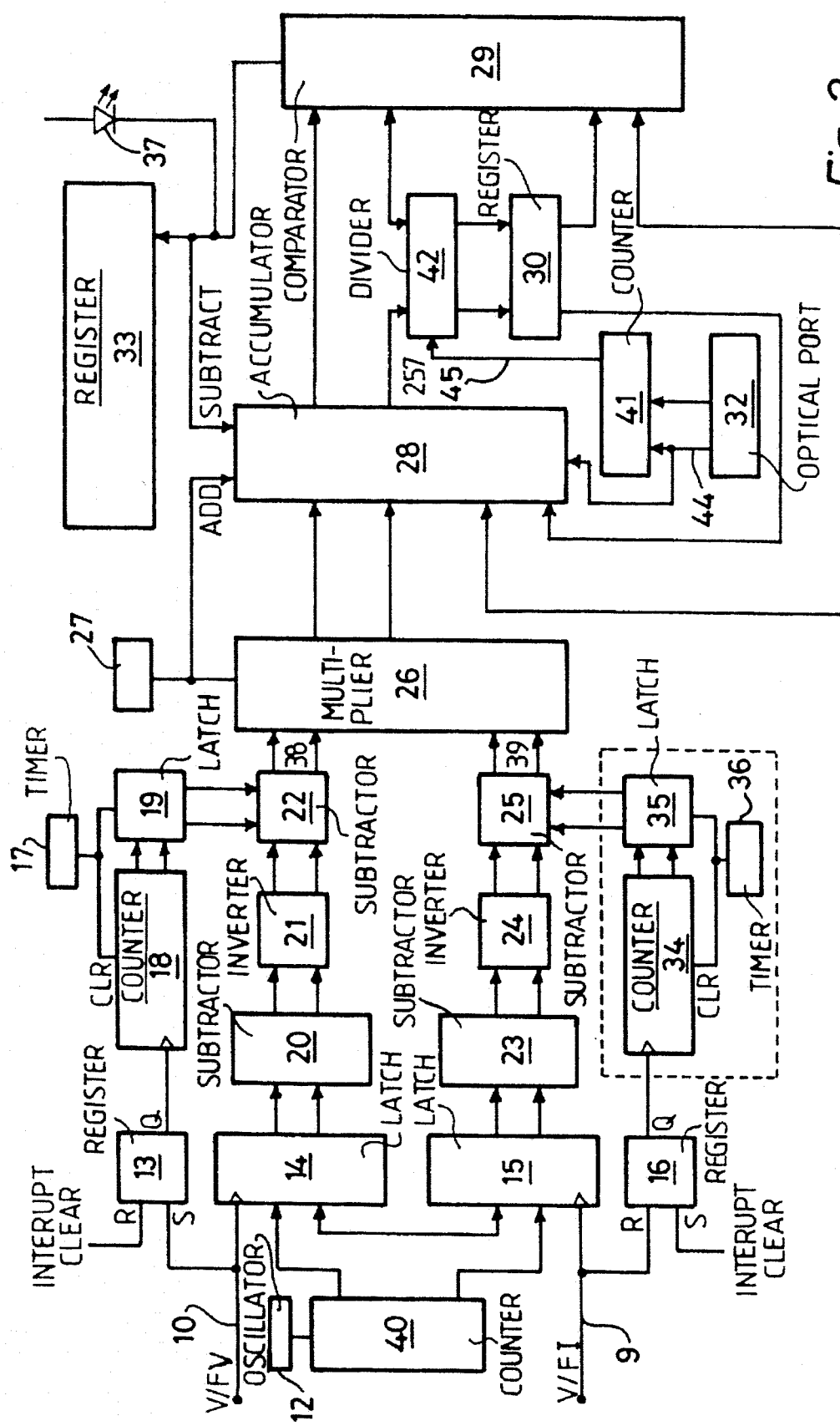
Figure 3:
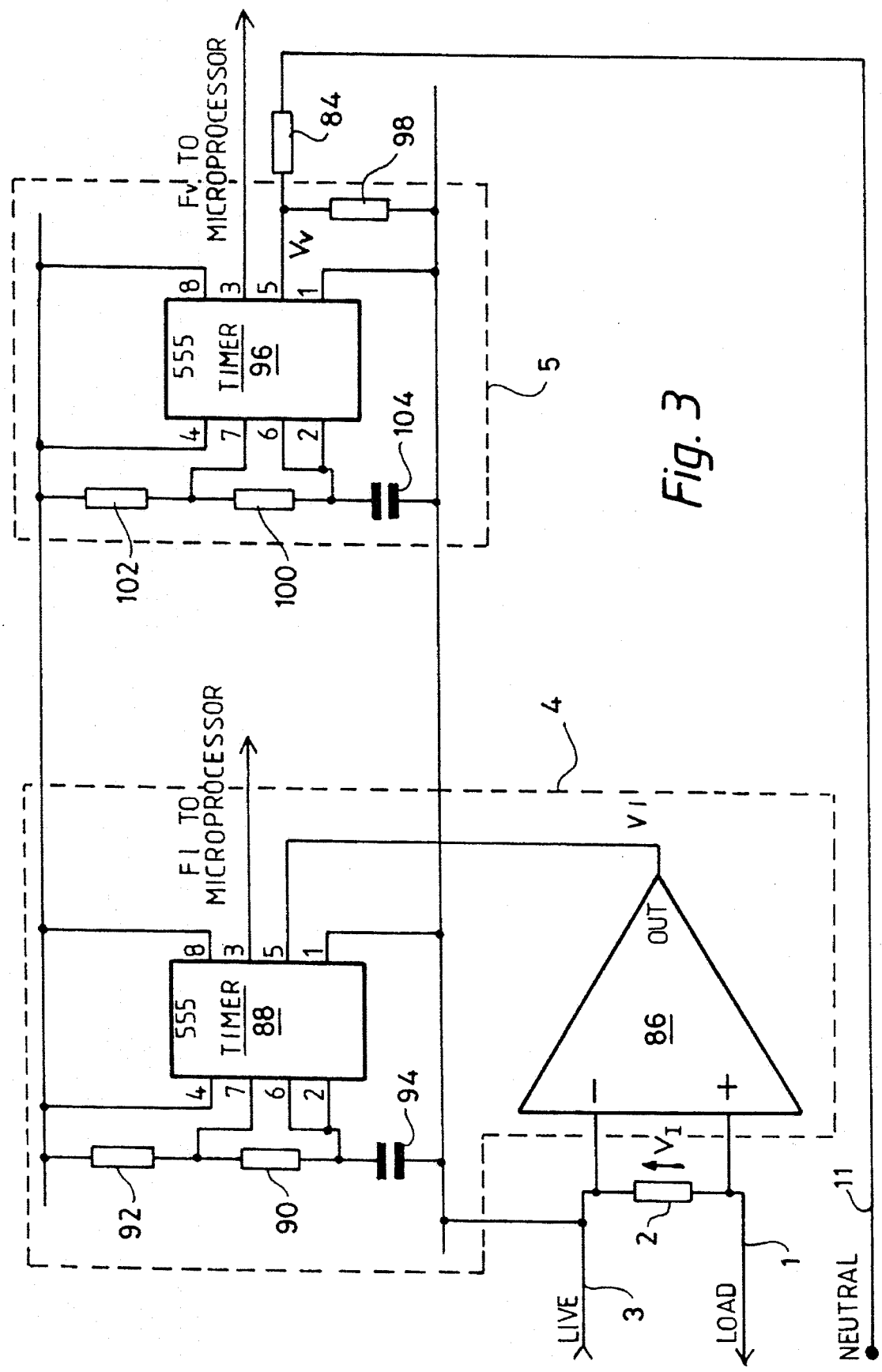
Figure 4:
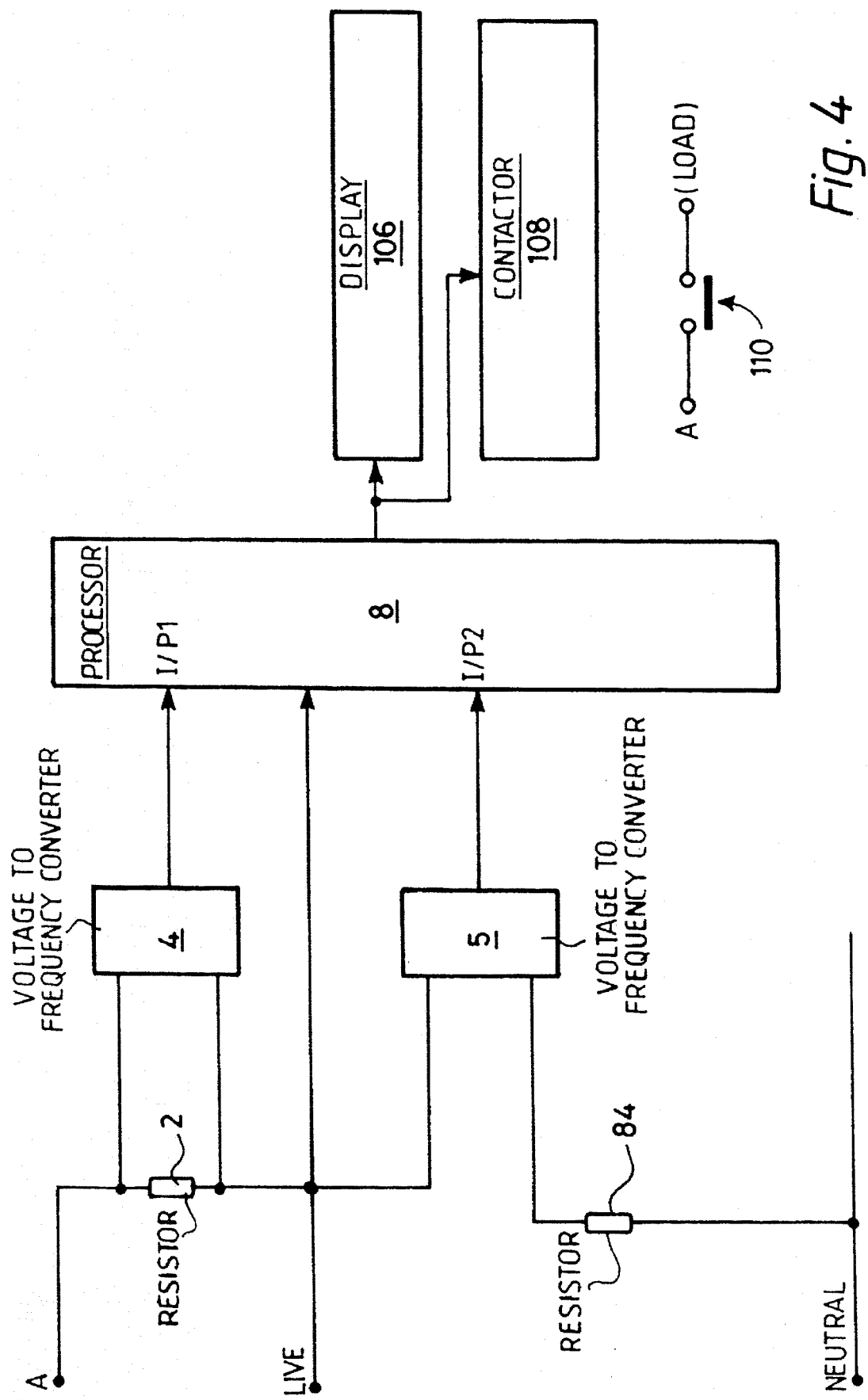
Figure 5:
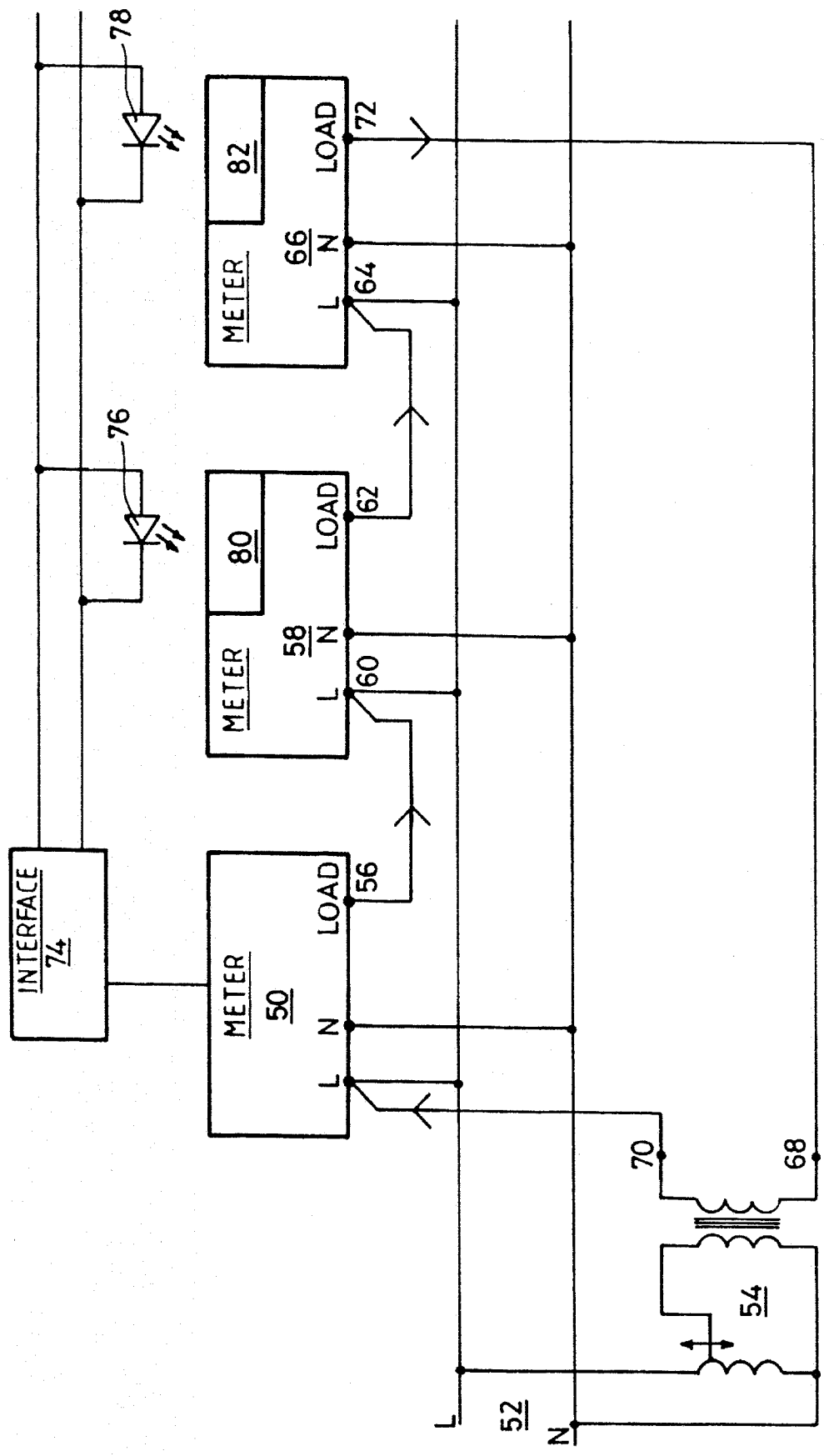
Figure 6:
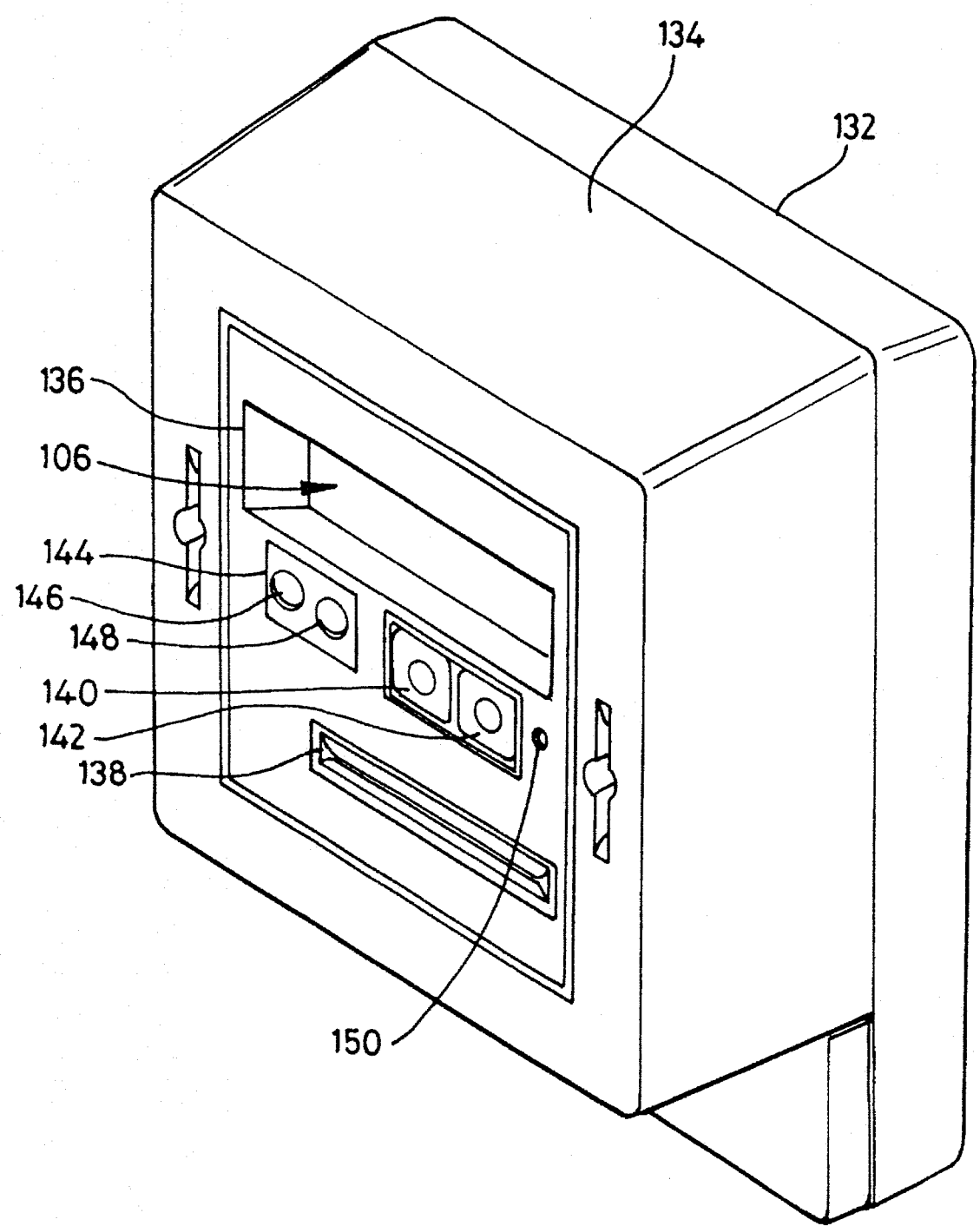
Figure 7:
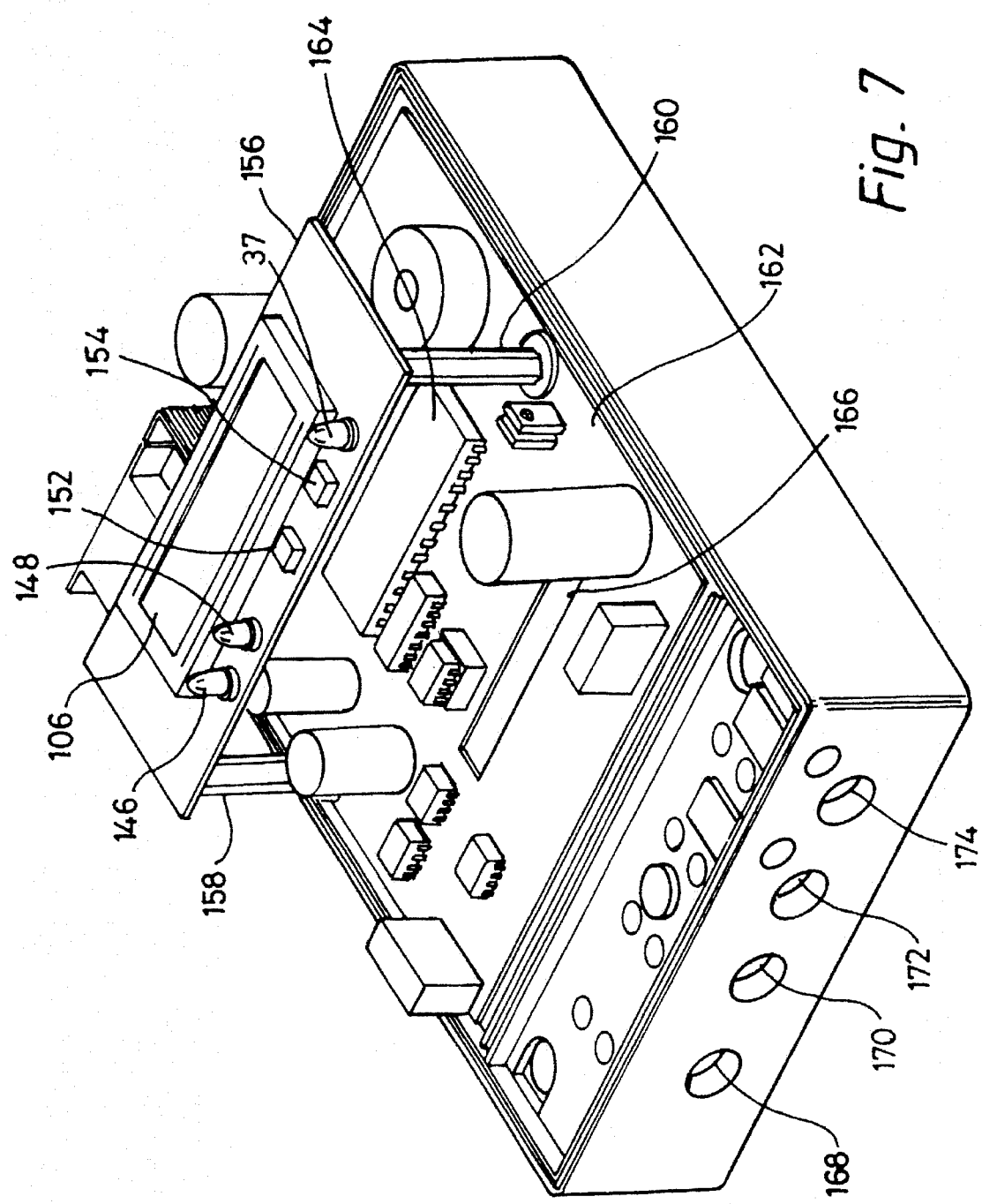
Figure 8:
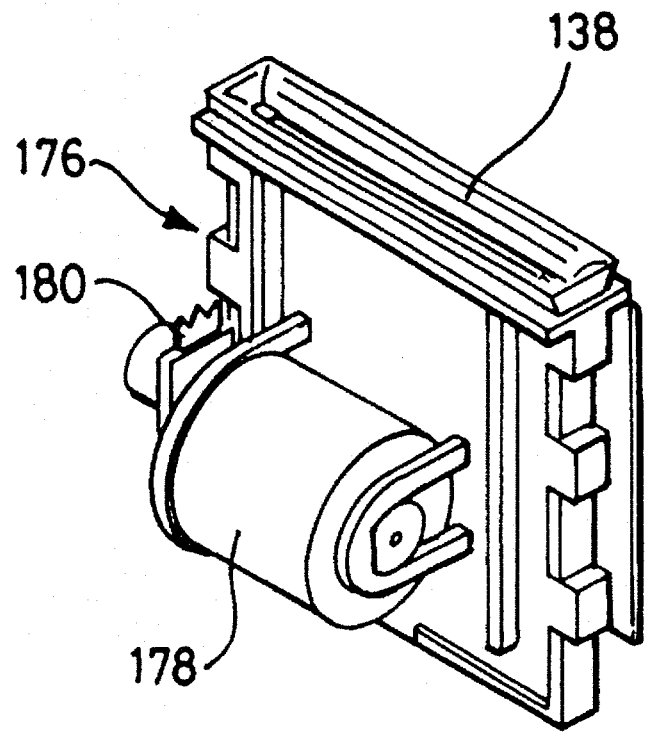
Figure 9:
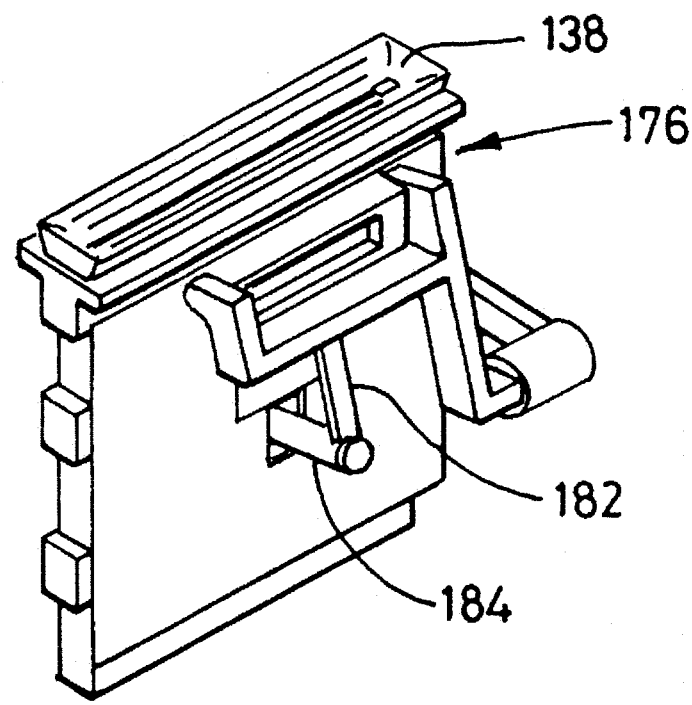
Figure 10:
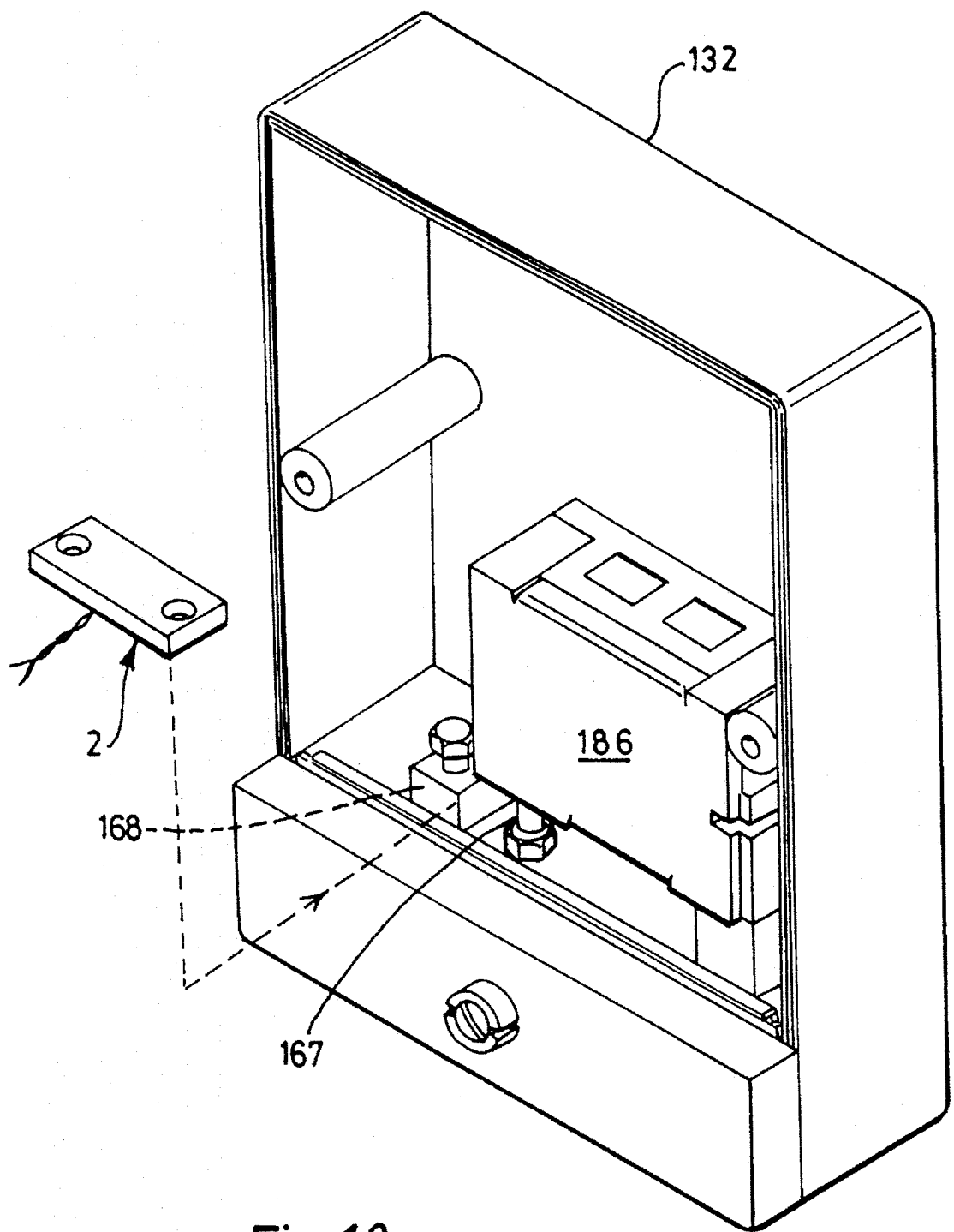
Figure 11:
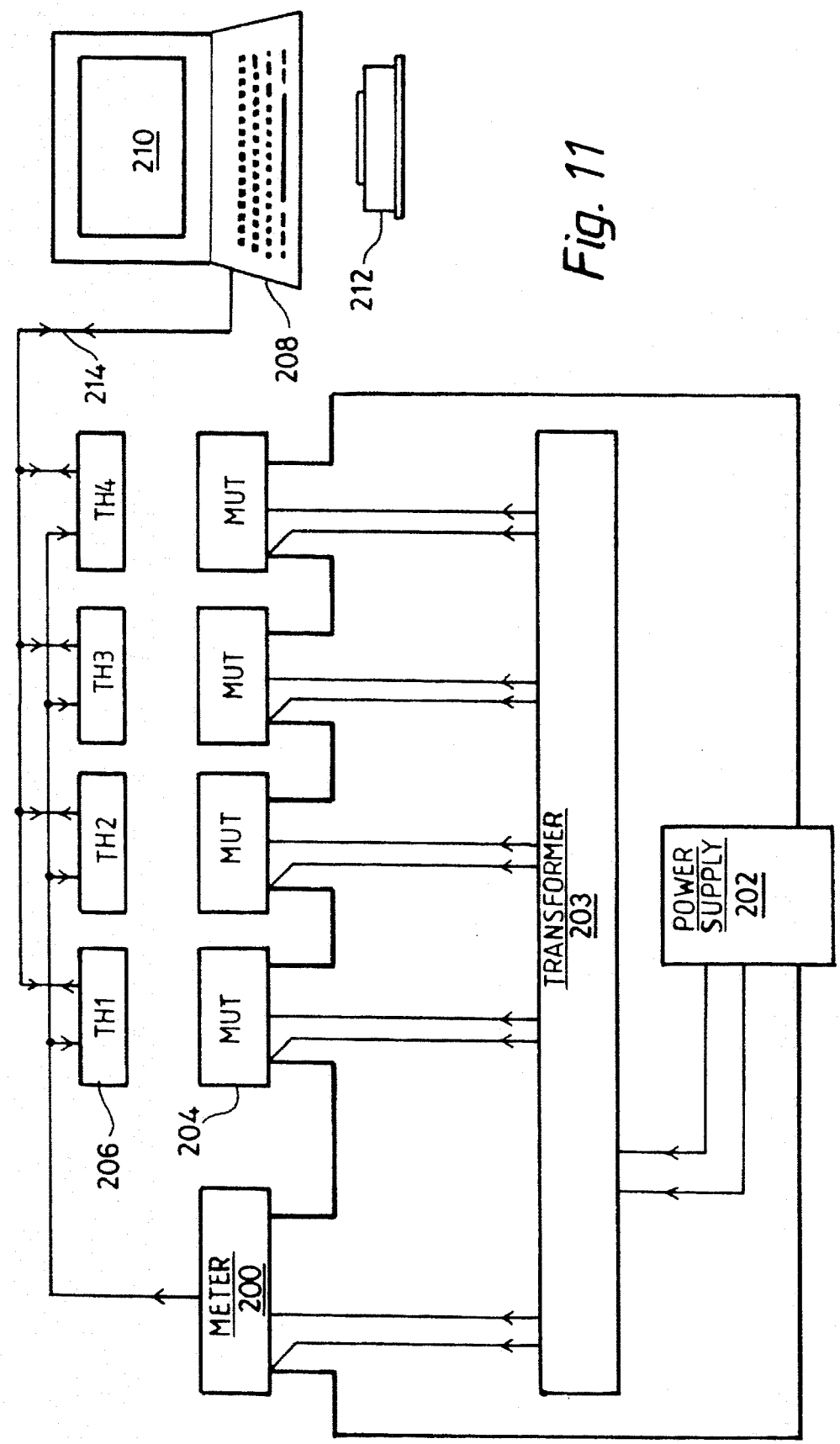

The invention will now be described by way of example with reference to the accompanying drawings, in which:

FIG. 1 is a simplified block circuit diagram of a power measuring meter, of the type which can be calibrated in accordance with the invention, FIG. 2 is a block circuit diagram of the elements which make up the processor employed in FIG. 1, FIG. 3 comprises a block circuit diagram of the voltage and current to frequency converters of FIG. 1, FIG. 4 illustrates a simplified form of meter based on FIG. 1 in which no opto-isolation of the processor is required from the voltage to frequency and current to frequency circuits, FIG. 5 illustrates how in accordance with one aspect of the present invention, two or more meters can be connected to a so-called substandard meter for simultaneous calibration, FIG. 6 illustrates a card controlled meter in its protective housing, FIG. 7 is a perspective view of the interior of the meter with the front housing cover and card reader removed, FIG. 8 is a perspective view of the card reader from one side, FIG. 9 is a similar view of the card reader from the other side, FIG. 10 is a perspective view of the rear of the meter housing with the pcb and card reader removed, to reveal the contactor and current shunt, and FIG. 11 is a block circuit diagram of a system for simultaneously calibrating a plurality of power measuring meters which requires less computing power to be available within each of the meters.

In order to better understand the calibration technique of the present invention, the construction and operation of a meter to which the calibration tehnique may be applied, will first be described with reference to FIGS. 1–4.

General Construction and Operation of Illustrated Meter

Referring to FIG. 1, the instantaneous potential of the mains supply is measured between the live line 3 and the neutral line 11 of a domestic supply. The voltage is converted to a pulse train by the voltage to frequency converter 5 which has a free running frequency of approximately 2,000 Hz which is modulated up or down in frequency depending on the polarity and amplitude of the potential excursion. Typically the base frequency is modulated by the supply voltage waveform signal to produce a frequency modulated signal with a deviation of plus or minus 200 Hz. The deviation is proportional to the instantaneous voltage of the waveform. The pulse train produced by the frequency to voltage converter 5 is coupled to input 1 of a processor 8 via an opto-isolator 7.

The instantaneous current flowing is measured by measuring the potential generated across a shunt resistor 2 connected in series with a live wire 3 of the supply to the consumer. This voltage is converted to a pulse train by a voltage to frequency converter 4 which also has a free running oscillator operating at a frequency of approximately 2,000 Hz. This base frequency is modulated by the supply current waveform signal to produce a frequency modulated signal with a deviation of plus or minus 200 Hz full scale. The deviation is proportional to the instantaneous current flowing to the consumer and the pulse train is coupled via an opto-isolator 6 to a second input of the processor 8.

The processor 8 provides signals for driving a display 106 (typically liquid crystal display) to indicate under normal operation, the accumulated numerical value of units of power measured by the meter, (as will be described in more detail with reference to FIG. 2).

Likewise a contactor 108 may also be controlled by an output signal from the processor.

The contactor is preferably a pulse operated device held into its last switched state by a spring or permanent magnet or both.

The contactor is only required if ON/OFF control of the supply to the consumer/load is required as in the case of a coin or a card controlled meter or a meter which is to be remotely controlled by the supply authority as by power line modulation.

Where provided, a power line signalling receiver or transmitter/receiver 112 provides control signals for the processor or receives data from the processor for transmission to the supply authority—as for example to indicate a fault condition in the meter or relay to the authority the accumulated value of measured power.

The card reader 114 likewise is controllable by signals from the processor and in turn produces electrical signals serving as signal inputs to the processor. Thus the processor may produce a signal to enable the card reader, cancel data on a card after it has been read, may receive data read from an inserted prepayment card for validating the card and can indicate to the processor the number of units to be permitted before requiring a further card to be inserted.

DC power for the voltage/current to frequency converter circuits 4 and 5 and the driving elements of the opto-isolators is derived from a halfwave rectifying circuit made up of diode 116 and reservoir/smoothing capacitor 118.

Typically the DC voltage requirement is of the order of a few volts for example 5–15 volts, and since the ac supply voltage will normally be 240 volts RMS or the like, a tapping 120 on the primary winding 122 of a transformer 124 can provide the lower ac voltage needed as input to the rectifying circuit 116/118.

Where isolation of the processor is required (as is essential if user accessible ports are provided on the meter), the dc power for the processor (and display, card reader, powerline communication receiver/transmitter, contactor etc when fitted) is derived from a second rectifying circuit supplied from the secondary winding 126 of the transformer 124 and comprising diode 128 and smoothing/reservoir capacitor 130.

The processor may be an integrated circuit capable of performing all the functions in FIG. 2, or an array of devices which collectively can perform the said functions.

In order to obtain the values of voltage and current, the processor has to measure the time between pulses. In the example shown this is achieved by the same method for both current and voltage, and will be described with reference to FIG. 2.

For simplicity the processor will be assumed to be a single integrated circuit ie a customised microprocessor chip.

Also for simplicity the controlling (central processing) element of the customised device of FIG. 2 is not shown, nor are the signal paths between it and the individual processing elements shown in FIG. 2.

A 16 bit counter 40 is continuously clocked by a crystal controlled oscillator 12 running at 5 MHz.

The output of the counter is connected in parallel to the inputs of two 16 bit latches 14 and 15. Latch 14 relates to the voltage and latch 15 to current.

The clock inputs of the respective latches are fed with the pulse trains of lines 9 and 10 respectively.

On the positive edge of a pulse on line 10, the value of the counter 40 is stored in the latch 14. The edge also provides an interrupt via the interrupt request register 13. The interrupt causes the value stored in the latch 14 to be read. To obtain a number indicative of the period between pulses, the value of the previous count is subtracted from the newly counted value in a subtractor 20. To produce a value proportional to frequency, the period is inverted by inverter stage 21 to produce the arithmetical reciprocal.

Simultaneously with the above counting and latching sequence, another counter 18 and latch 19 average the incoming voltage related frequency over a 40 second period determined by a timer 17. This average voltage related frequency is then subtracted by 22 from the instantaneous voltage related frequency to give numerical output value at 38 proportional to the instantaneous voltage. This feature allows the the voltage "base" frequency to be continuously autozeroed to cater for long term drift.

A second channel accepts the signal representative of current along line 9 and produces a value 39 proportional to the instantaneous current in exactly the same way as the signal 38 is produced corresponding to voltage.

The current value channel has a similar arrangement to the voltage channel for producing an average value of the current related frequency, but typically this is only performed once during calibration, during manufacture. The items concerned are labelled 34, 35 and 36. The average or base current related frequency value is subtracted from the values of instantaneous current frequency which arise during use, giving a frequency value proportional to the instantaneous current, for supply as signal 39.

The two signals 38 and 39 are the inputs to a four quadrant multiplier 26. As these two signals are asynchronous, the multiplication is caused to occur at regularly occuring intervals of time displaced by, for example, 500 microseconds. A suitable timing or interrupt circuit 27 produces the necessary control signals for the multiplier. The latter uses the input signal present at 38 and 39 at each instant in time and each result is then passed to an accumulator 28 which keeps a total of the power consumed. The running total in the accumulator is compared in the comparator 29 with a number, from register 30 which is equivalent to a 1/1000th of a kilowatt hour. When this value is reached or exceeded a current pulse is generated causing the kilowatt hour register 33 to be incremented by one and if desired a front panel light emitting diode (LED) 37 can be triggered to flash. The value in 30 is also subtracted from the register (accumulator) 28 in response to the generation of the count pulse.

It is to be noted that if the value in the register 28 is greater than the value from 30 the excess will remain in the register 28 and will count towards the new accumulating value in the register. This significantly improves the accuracy of the measuring technique since in this way no part of any power signal computed by multiplier 26 will be lost and over a long period of time the shortfall in the kilowatt hour register 33 would be quite considerable if the overflow amounts left in the accumulator register 28 were (in fact) to be disregarded.

The processor 8 may include memory means (not shown) in which one or more programmes or instructions can be stored for recall in response to appropriate interrupts and/or input signals, to cause the processor to perform the functions described in relation to FIG. 2.

If the functions shown in FIG. 2 are to be performed by a single processor, sequencing and buffering where required, must be introduced to permit steps 14, 20, 21, 22 and 15, 23, 24, 25 to be performed in series. Thus buffer delays (not shown) may be introduced between 14 and 20 and between 15 and 23, so that the latched value in 14 for example is processed first to produce a value at 38 and thereafter the latched value in 15 is processed to produce a value at 39. By buffering the value 38, so it will still be available for multiplication in 26 with the value 39. It will further be seen that multiplication in 26 should be performed only after latched values from 14 and 15 have been processed, and accordingly a hierarchial logic may be incorporated to ensure that multiplication is only performed by 26 when the input states thereof are appropriate.

FIG. 3 illustrates a preferred circuit for providing two frequency modulated signals corresponding to the instantaneous values of supply voltage and load current of FIG. 1.

Certain of the components and connections are common to elements in FIG. 1 and to this end the same reference numerals have been employed.

The shunt should develop the smallest possible potential difference $v_I$. To this end a differential amplifier 86 is employed to generate a larger signal $V_I$ for supply to pin 5 of a type 555 timer 88.

Mean frequency controlling circuit elements 90 and 92 provide potentials for pins 2, 6 and 7 and a charging/discharging capacitor 94 is connected between pin 2 (which is also connected to pin 6) and the live line. Pin 3 provides the $F_I$ output signal which may be supplied directly to the processor 8 (as shown in FIG. 4) or via an opto-isolator 6 as shown in FIG. 1.

A second 555 timer 96 forms the basis of the supply voltage to frequency converter 5. A small fraction of the supply voltage (between the LIVE line 3 and the NEUTRAL line 11) is produced by a potential divider made up of resistors 84 and 98. The desired small fraction appears across the resistor 98. This potential difference appears between pins 1 and 3 of 96. As before the mean frequency of operation of 96 is controlled by RC elements 100, 102 and 104 and typically the resistors 100 or 102 or both are made adjustable so that the frequency of 5 can be made the same as that of 4. (Alternatively or additionally the resistor 90 or 92 or both may be made adjustable).

As before the $I_F$ signal is derived from pin 3 of the 555 device and is supplied either directly (as shown in FIG. 4) or via an opto-isolator 7 as shown in FIG. 1, to the second input of the processor 8.

FIG. 4 merely shows diagrammatically how in a simple meter (in which there is no user accessible port such as coin freed mechanism or card reader) but merely a display with or without a contactor for local or remote ON/OFF control of the supply, the need for opto-isolators is removed. To this end the processor 8 is at LIVE rail polarity as is consequently the display 106 and actuator coil of the contactor 108 if provided. Where the latter is provided the LOAD terminal is connected to the terminal A of FIG. 4 via the contacts 110. The latter is to advantage a spring and/or permanent magnet assisted contactor requiring positive and negative pulses only for operation to open and close the contacts 110.

Where the contactor is not required, the load is connected direct to terminal A.

Calibration

The number used to indicate a 1/1000th of a kilowatt hour is at least initially adjustable and in accordance with the present invention, is adjusted during manufacture to enable calibration of the meter against a standard. This provides a method for calibration of the meter during manufacture and if required following any subsequent refurbishment.

Calibration is performed by comparing the power measured by a meter under test with the power measured by a "standard meter" set to measure the same voltage and current parameters over the same period of time. Although a so-called standard quality meter is ideally used, in practice meters which are not quite up to standards quality may be used as the reference and such meters are commonly referred to as sub-standard meters.

Such a meter is that produced by Landis and Gyr under the code TVE 102/1. These meters deliver an electrical pulse for each 1/500,000th of a kilowatt hour measured by the meter. Each such pulse is called a unit power pulse.

As described with reference to FIG. 2 the numerical value with which the accumulated value being registered at 28 is to be compared (to determine when a 1/1000th of a kilowatt hour has been registered by the meter) can be adjusted for calibration purposes. This numerical value is held in the register 30.

Since the pulses to be accumulated by the meter under test should correspond to 1/1000th kilowatt hour, an interface 74 is provided which includes divider devices (not shown), typically CMOS type CD 4510B connected to provide a 500:1 ratio, so that one value is delivered by the interface for every 500 pulses received from the "standard" meter 50.

The permanent value for register 30 is arrived at by feeding via optical port 32 pulses from the interface 74 to a counter 41. The value in counter 41 is initially set to zero by a reset pulse on line 44. This reset pulse may for example be the first to arrive of a sequence of pulses from the sub-standard meter or a specially generated reset pulse. The incrementing value in register accumulator 28 is also reset to zero by the same reset pulse on line 44. If (as is arranged) both meters are set to measure the same voltage and current, pulses arriving from the sub-standard meter via interface 74 and port 32 increment the counter 41, and in a similar manner the numerical value in the register accumulator 28 is incremented by the action of the power measuring circuits of the meter under test as described with reference to FIG. 2.

Counter 41 is set to generate an output pulse when N pulses have been received from the interface 74 and this trigger is supplied to the divider 42 to divide the numerical value which has been accumulated in the accumulator register 28 by the value N to produce a numerical value for latching into the register 30.

The value of N may be 256 to simplify the division step and ensure a relatively long period in which the sub-standard meter output is compared with the meter or meters under test. To this end the arrival of the 257th pulse can be used to serve as the trigger to generate the divider instruction pulse along line 45.

It is to be understood however that the numerical value N is quite arbitrary and any value can be chosen which is convenient and sufficiently large enough to ensure that enough unit power pulses have been received to ensure an accurate value after division by N for insertion in the register 30.

After the comparator register 30 is latched it is preferably WRITE-inhibited in any known manner to prevent unauthorised recalibration of the meter.

As shown in FIG. 5 a sub-standard meter 50 may be connected between the L and N terminals of a supply 52 and is received current flowing from the terminals 68, 70 of the secondary of a current transformer 54.

One terminal 70 of the current transformer secondary is connected to the L terminal of the sub-standard meter 50 and in order to ensure that the same current passes through the current measuring circuits of all the meters, the LOAD terminal 56 of the sub-standard meter is connected to the LIVE terminal 60 of the first meter under test 58 and the LOAD terminal 62 of that meter is connected to the LIVE terminal 64 of the next meter under test 66 and so on, until the last meter in the chain where the LOAD terminal is connected to the terminal 68 of the load.

In FIG. 5 only two meters are shown under test and it is therefore the LOAD terminal 72 of the second meter 66 which is connected to the load terminal 68.

In order to convey unit power pulses from the sub-standard meter 50 to a number of meters under test 58 and 66 etc, the interface unit 74 pulses serve to drive a chain of of LEDs 76, 78 etc and cause the latter to flash in synchronism therewith. By positioning each LED 76, 78 etc opposite the opto communication ports 80, 82 respectively of the meters under test, so the pulses derived from the unit power pulses from the sub-standard meter 50 can be used to calibrate all of the meters in the chain.

General Construction of Meter (continued)

The assembled meter of FIGS. 1 and 2 is shown in FIG. 6 within a two part housing comprising a base unit 132 and front cover 134. The latter is adapted to be panel or wall mounted and the front cover includes a panel containing a viewing window 136 through which a display 106 can be seen. The slot of a card reader 106 is shown at 138 and finger operable control buttons 140 and 142 allow the meter to be programmed after appropriate instructions have been entered via an opto communications port 144 containing an LED 146 and light sensitive transistor 148.

The LED 37 which flashes when unit power pulses are generated is also visible through the window 150.

Removing the front cover and card reader allows the inside of the meter to be seen as shown in FIG. 7. Here the display 106 is shown mounted on a small pcb 156 carrying also the receiver and transmitter units 146, 148 of the opto communications port 144, switches 152 and 154 operable by the press pads 140 and 142 in FIG. 6, and the LED 37 (of FIG. 2). The small pcb 156 is mounted by standoffs 158 and 160 from the main pcb 162 on which is mounted a central processor chip 164 and related power supplies and buffer circuit elements, the opto isolators, the 555 timer devices 88, 96, the differential amplifier 86 and related decoupling and signal coupling paths and devices. A slot 166 is provided into which the inboard end of a card reader can be fitted and located.

Cable connections are provided at 168, 170, 172 and 174 for connecting the Live, Neutral In, Neutral Out, and Load (ie for example the live busbar of a domestic supply).

FIGS. 8 and 9 show the card reader as comprising a shallow box-like member 176 defining a slot 138 at one end and having on one face a DC motor 178 adapted to draw in and eject cards via a claw drive 180 and on the other face an erasing device comprising a pivotted arm 182 bearing a permanent magnet 184 which during reverse movement of the card (not shown) is moved under the action of the motor drive into contact with the magnetic stripe on the card to erase magnetic data stored thereon.

Reading and writing control circuits for receiving signals from and supplying signals to a read/write head (not shown) also mounted on one face of the box 176, are also carried by the latter.

Beneath the main pcb 162 as shown in FIG. 10, is located a contactor 186 which for convenience supports the shunt 2 (of FIG. 1) itself connected between one terminal 167 of the contactor and one of the cable connectors 168 etc of FIG. 7.

FIG. 11 is a block schematic diagram of a calibration system by which a large number of power meters of the type described herein can be calibrated at the same time. The arrangement is based on that shown in FIG. 5 but by providing processing power at each test head, so calibration computation and control can be removed from the on board processor in each meter freeing the meter processor for other functions.

As shown the system comprises a standard meter 200 (sometimes referred to as a substandard meter) which produces unit power pulses to a high level of accuracy considerably in exces of the accuracy required of the meters to be tested and calibrated, a power supply 202 providing a controlled voltage to the primary of a transformer 203 having M secondary windings, one for each meter to be tested and a controlled current source for causing a common AC current to flow through each of the meters including the Standard meter 200, which to this end are connected in series as shown.

Each meter (such as 204) is located opposite a testhead (such as 206), each of which includes a microprocessor (not shown) and an opto-electric interface port (not shown) compatible with an LED transmitter on each meter which transmits to the testhead port detector pulses proportional in frequency to the power measured by the meter and receives from the testhead port transmitter signals for controlling and calibrating the meter 204 under test.

Each testhead also receives electrical pulses from the reference signal output of the standard meter 200. These are typically produced at the rate of 500,000 pulses per KWhour. A programmable computer 208 and screen 210 and associated printer 212 complete the system. The computer 208 receives signals from and transmits signals to the testheads via a bi-directional serial ink 214.

The procedure for calibration is as follows:

1. The control computer 208 will establish a communication link with each meter via its testhead and optical port.

2. The test supply is adjusted to a suitable load point for the meters under test (24A, power factor=1).

3. A default calibration coefficient is then loaded into each of the meters, from their testheads.

4. Each testhead is then put in the count mode, so as to count the number of reference pulses from the standard meter 200, for a period determined by its own meter. This period lasts for n flashes of the consumption indicator LED of the meter associated with the testhead.

5. When the count period has finished the PC 208 interrogates the testheads in turn to obtain the reference pulse count for each meter in turn.

6. Knowing the pulse count expected, the pulse count received and the default calibration coefficient, an accurate calibration coefficient is then calculated for each meter. These new values are then loaded into the meters via the optical ports.

7. This calculation is performed separately for each meter to enable its unique coefficient to be loaded into the meter.

8. Steps 4 and 5 are then repeated and an accuracy figure is calculated for each meter.

The above procedures set the "gain" of the meters power consumption calculations. A second set of operations adjusts for any variation in the "zero offset" of the meters as follows:

9. The test supply is adjusted to provide a small current flow through the meters (1A power factor=1).

10. Each meter is then programmed with a default offset value.

11. Each testhead is then put in the count mode. The testhead will then count the number of reference pulses, from the standard meter for a period determined by its own meter. This period lasts for x flashes of the consumption indicator LED of the meter concerned.

12. When the count period has finished the PC 208 interrogates the testheads in turn to obtain the reference pulse count for each of the meters.

13. Knowing the pulse count expected, the pulse count received, the default offset value and the time taken for the x pulses, an accurate offset value can be calculated. These new values are then loaded into the meters via the optical ports.

14. Steps 11 and 12 are repeated and the accuracy of each meter is calculated to ensure each meter is within specification.

15. With the test current adjusted to various points within the meters operating range, reference pulses are counted at each point and the meters are checked to be within the overall accuracy requirements.

Although only four meters are shown in FIG. 11 this technique can be applied to any number of meters under test.

The only requirement is that there is a testhead for each meter.

We claim:

1. In a power measuring meter to be calibrated against a standard meter, the power measuring meter being adapted to produce an output signal proportional to the product of a supply voltage and current flowing through a load connected thereto by deriving a first signal proportional to the supply voltage and a second signal proportional to the load current, so that a product signal is produced, the product signals being accumulated in a first register to produce a unit power pulse when a predetermined value has been accumulated in the said first register, which unit power pulses are in turn accumulated in a power register to indicate total power measured, a calibrating apparatus comprising:

(1) interfacing means for receiving power pulses from the standard meter, (2) a counter connected to the interfacing means for generating a calibration signal when the number of the accumulating power pulses received by the counter equals a value N, (3) divider means connected to the counter for dividing the value of the same power pulses accumulated in the first register by the value N, whereby to produce a reference value in response to the generation of a calibration signal, and (4) a second register connected to the divider means and to the first register for retaining the said reference value for future reference within the power measuring meter, whereby to constitute the said predetermined value at which the first register produces a unit power pulse.

2. Calibration apparatus as claimed in claim 1, wherein the unit power pulses from the standard meter are available at an output socket and the said calibrating circuit means comprises conductor means for connecting the said output socket to an input socket on the meter under test for conveying the unit power pulses from the standard meter to the said first register in the meter under test.

3. Calibration apparatus as claimed in claim 2, wherein the standard meter produces a greater number of unit power pulses per KWH than is generated per KWH by the circuits of the meter under test, and the calibrating circuit means further includes divider means to produce one pulse for every n pulses from the standard meter.

4. Calibration apparatus as claimed in claim 1, wherein the meter under test includes an optical communication port and the circuit means comprises a housing containing a light source, conductor means for connecting to the said output socket to convey unit power pulses to the housing, driver means within the housing for generating electrical signals to energise the light source to produce a flash of light for a predetermined number of unit power pulses supplied thereto from the standard meter and the housing and the meter under test are positioned so that light from the light source is projected towards the optical communication port of the meter under test, and electrical signals generated by circuit means in the said meter from each received flash of light are accumulated in the second register of the said meter.

5. A method of calibrating meters adapted to measure power by accumulating in a primary data accumulating means data values proportional to the product of signal values which are proportional respectively to a supply voltage and to the current flowing through a load connected thereto, generating a unit power pulse each time the accumulating data value has increased by a predetermined amount, and accumulating the number of unit power pulses as a numerical value indicative of the power consumed by the load, comprising the steps of:

(1) establishing a path for supplying to a counter power pulses from a standard meter, (2) setting the primary data accumulating means of a meter under test and the said counter to a known value, (3) causing the standard and test meters to measure the same supply voltage and load current and generating a stop signal when the accumulating value in the counter equals a predetermined value N, (4) employing the stop signal simultaneously to latch the value in the primary accumulating means in the meter under test and divide the latched value by N to form a quotient value, and (5) entering the quotient value into a second register within the meter under test, which is adapted to store the said predetermined value with which accumulating values in the primary accumulating means are to be compared, to determine when unit power pulses are to be generated by the meter under test during future power measurement by the said meter.

6. The method of calibration as claimed in claim 5, further comprising the step of disabling the facility for writing to the said reference value memory means after a meter under test has been calibrated.

7. The method of calibration as claimed in claim 5, wherein the calibration computations are performed by externally located processing means which receives data from and transmits data to the meter under calibration.

8. The method of calibration as claimed in claim 7, wherein a master processor is programmed to control the complete sequence of calibration tests on a plurality of meters which communicate therewith and with a standard meter via a corresponding number of intermediate externally located processors, one for each meter under test.

9. The method of claim 8, wherein the master processor is linked to a printer or other output means for providing a readable output of the results of the tests.

10. The method of claim 9, wherein the master processor is also programmed to print calibration labels and serial numbers for those meters for which the results of the tests thereon confirm to predetermined limits and specifications.

11. In a calibration method as claimed in claim 8, the standard meter is arranged to supply reference signals to the meter under calibration, and as a preliminary step the master processor sets counters in the intermediate processors to zero, and thereafter each intermediate processor is set to count into its first counter the number of unit power pulses transmitted thereto from the standard meter and into its second counter the number of unit power pulses transmitted thereto from is its associated meter under test, the standard meter and the meters under test being subject to the same supply voltage and the same load current, and the number accumulated in the first counter is latched when the number in the second counter becomes equal to a predetermined number and as a second step the intermediate processors are interrogated in turn and the latched values of the first counters therein are read into the master processor memory and as a third step the master processor computes a calibration coefficient, or controls each intermediate processor to compute a calibration coefficient, for each meter under test and controls the insertion of the computed calibration coefficient into each meter memory, each calibration coefficient serving to control the number of pulses produced by its meter for a given quantity of electrical power measured by the meter.

12. Calibration method as claimed in claim 11, in which the master processor is programmed to perform a further calibration test to be performed on each meter by repeating the counting of reference pulses from the Standard meter and unit power pulses from the meters under test, the latter now operating under the control of the inserted calibration coefficients, to compute an accuracy figure for each meter under test from the new value in the second counter of its associated intermediate processor.

13. Calibration method as claimed in claim 12, wherein the master processor is programmed to perform still further calibration tests on the meters under test at a low value of load current and at different higher values of load current, and perform checks on the power measured by each meter for each said current value and record the results, to enable the overall accuracy of each meter to be obtained from the recorded results.

14. Calibration method as claimed in any of claims 8 to 13, wherein the master processor is a programmable computer.

* * * * *